US007174955B2

(12) United States Patent
Zhong et al.

(10) Patent No.: US 7,174,955 B2
(45) Date of Patent: Feb. 13, 2007

(54) HEAT SINK

(75) Inventors: Yong Zhong, Shenzhen (CN); Wan-Lin Xia, Shenzhen (CN); Tao Li, Shenzhen (CN)

(73) Assignees: Fu Zhun Precision Industry (Shen Zhen) Co. Ltd., Guangdong Province (CN); Foxconn Technology Co., Ltd. (TW)

( * ) Notice: Subject to any disclaimer, the term of this patent is extended or adjusted under 35 U.S.C. 154(b) by 0 days.

(21) Appl. No.: 11/018,070

(22) Filed: Dec. 20, 2004

(65) Prior Publication Data
US 2006/0076121 A1 Apr. 13, 2006

(30) Foreign Application Priority Data
Oct. 8, 2004 (CN) .................. 2004 2 0082906

(51) Int. Cl.
*F28F 7/00* (2006.01)
*F28D 15/00* (2006.01)
(52) U.S. Cl. ..................................... 165/185; 165/80.3
(58) Field of Classification Search ................ 165/185, 165/104.33, 104.34, 80.3, 76, 78; 361/702–704, 361/709–710; 174/16.3
See application file for complete search history.

(56) References Cited

U.S. PATENT DOCUMENTS 5,038,858 A * 8/1991 Jordan et al. ............... 165/185
6,449,160 B1 * 9/2002 Tsai ............................ 361/709
6,474,407 B1 * 11/2002 Chang et al. .............. 165/80.3
6,607,023 B2 * 8/2003 Ho et al. ..................... 165/78
6,619,381 B1 * 9/2003 Lee ............................. 165/78
6,639,802 B1 * 10/2003 Dong et al. ................. 361/709
6,672,379 B1 * 1/2004 Wang et al. ................ 165/185
6,742,581 B2 * 6/2004 Mochizuki et al. ......... 165/185
6,772,828 B1 * 8/2004 Chen ............................ 165/78
2004/0231827 A1 * 11/2004 Fu et al. .................... 165/80.3

FOREIGN PATENT DOCUMENTS

TW 526949 4/2003
TW 543841 7/2003

* cited by examiner

*Primary Examiner*—Tho Duong
(74) *Attorney, Agent, or Firm*—Morris Manning & Martin; Tim Tingkang Xia, Esq.

(57) ABSTRACT

A heat sink (10) includes a plurality of fins (12) joined with each other. In one embodiment, each fin includes a main body (13) with an elongated flange (14) and two shortened flanges (16) extending from each of two opposite sides thereof. The shortened flanges extend from the body in an opposite direction to the elongated flange with the elongated flange located therebetween. The elongated flange (14) defines two holes (142) at respective opposite sides thereof and each shortened flange (16) provides an engaging piece (164) in alignment with one hole of the elongated flange. The engaging pieces of one fin engage in corresponding holes of an adjacent fin to thereby combine the fins together.

4 Claims, 5 Drawing Sheets

HEAT SINK

CROSS-REFERENCE TO RELATED APPLICATIONS

This application is related to a copending U.S. patent application entitled "COOLING FIN ASSEMBLY", filed with the same applicants and assignee as the invention on Dec. 20, 2004 with the application Ser. No. 11/018,290. The disclosure of the above identified application is incorporated herein by reference.

Technical Field

The present invention relates generally to heat sinks, and more particularly to a heat sink having a plurality of cooling fins fastened and joined with each other for heat dissipation of electronic devices.

BACKGROUND

It is widely acknowledged that heat is produced during operations of electronic devices such as chipsets or processors of computers. The faster the operation speed is, the larger the amount of heat produced is, and the higher the temperature of the electronic device becomes. However, excessive high temperature of the electronic device is likely to affect operations thereof and even results in computer crashes. Therefore, heat dissipation devices such as heat sinks are desirably needed for heat dissipation of these electronic devices.

FIG. 7 shows a conventional heat sink which includes a plurality of fins 30 stacked together. Each of the fins 30 comprises a main body 32 and two flanges 34 extending perpendicularly from respective top and bottom side edges of the body 32. Each fin 30 provides recess portions 36 and corresponding protrusion portions 37 at the flanges 34 thereof. The protrusion portions 37, with abutting elements 38 formed thereon, are connected to the flanges 34 via neck portions 39. In assembly, the protrusion portions 37 of one fin are inserted into the corresponding recess portions 36 of an adjacent fin to cause the abutting elements 38 thereof to snappingly engage with a front face of the adjacent fin, thereby assembling the fins 30 together. However, the neck portions 39 of the fins 30 are small-sized and therefore provide poor combination abilities. The abutting elements 38 of the one fin are easily disengaged from the front face of the adjacent fin 30 when the assembled fins are subject to mechanical shocks.

SUMMARY OF THE INVENTION

Accordingly, an object of the present invention is to provide a heat sink having a plurality of fins securely fastened and joined together.

In order to achieve the object set out above, a heat sink according to an embodiment of the present invention comprises a plurality of cooling fins stacked between two opposite outmost cooling fins. Each of the plurality of cooling fins comprises a main body. At least one side edge of the main body provides at least two flanges extending in opposite directions from the main body. One flange defines a hole therein and the other flange has a connecting piece formed therefrom. The free end of the connecting piece forms an engaging piece in alignment with said hole. The engaging piece of each of the plurality of cooling fins engages in the hole of an adjacent cooling fin to thereby fasten and join the plurality of cooling fins with each other.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
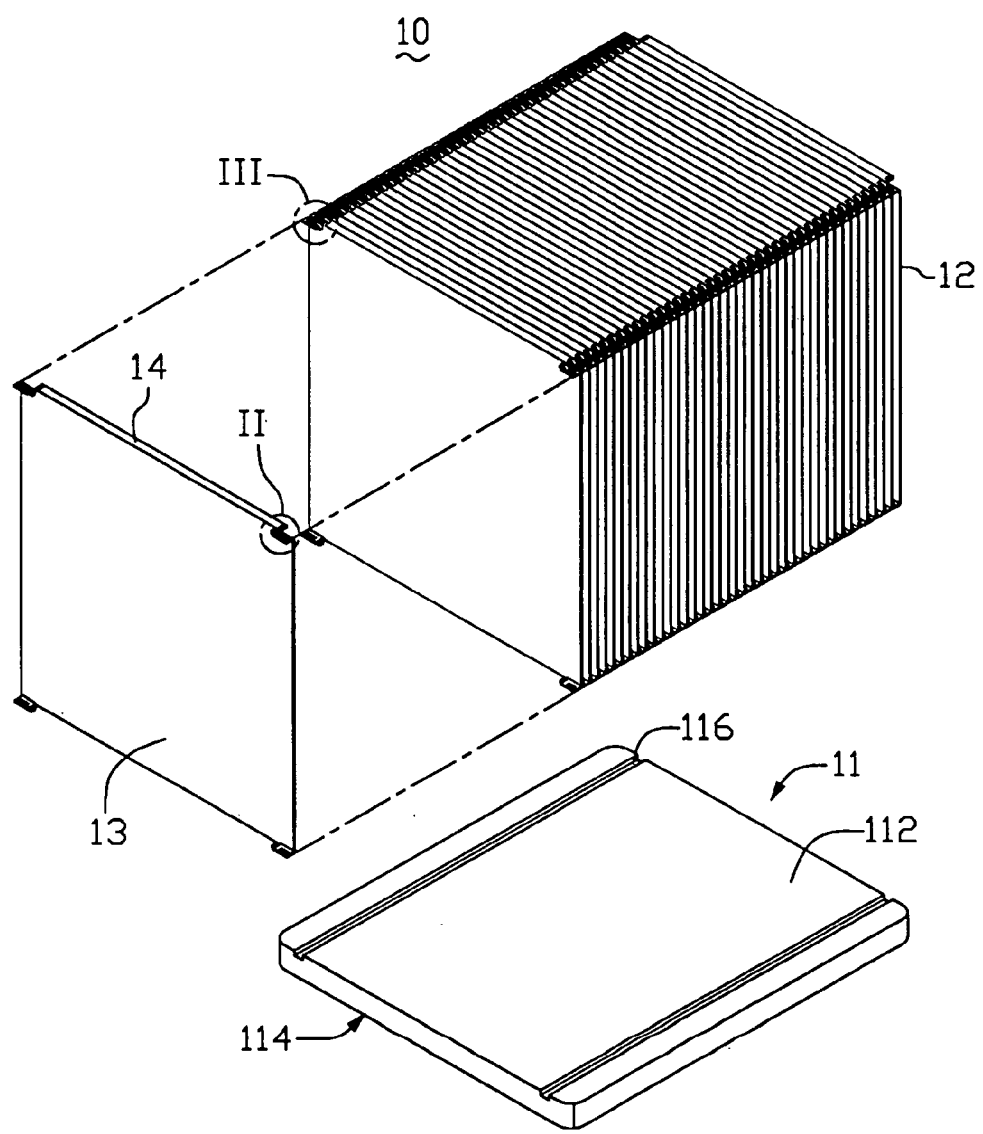
FIG. 1 is an isometric view illustrating a heat sink according to an embodiment of the present invention.

Reference will now be made to the drawing figures to describe the present invention in detail.

FIG. 1 illustrates a heat sink 10 according to a preferred embodiment of the present invention. The heat sink 10 is suitable for heat dissipation of electronic devices such as central processing units (CPUs) of computers. The heat sink 10 includes a base 11 having a top face 112 and a bottom face 114 opposite to the top face 112, and a plurality of spaced cooling fins 12 attachable to the top face 112 of the base 11. The base 11 on the top face 112 defines a pair of parallel grooves 116 at respective opposite sides thereof. Each of the fins 12 includes a main body 13 with a pair of elongated flanges 14 (only one visible in FIG. 1) extending transversely from respective top and bottom side edges of the body 13.

Figure 2:
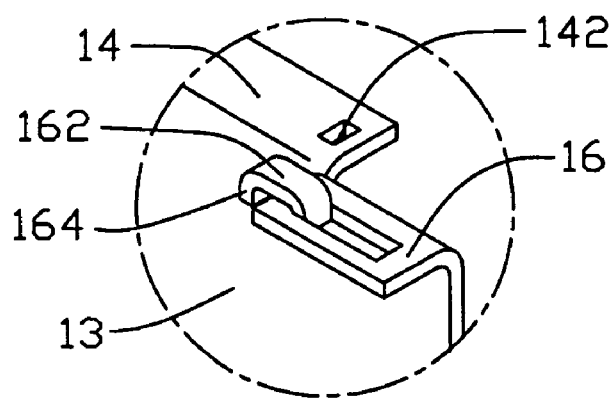
FIG. 2 is an enlarged view of an indicated portion II of FIG. 1.
Figure 3:
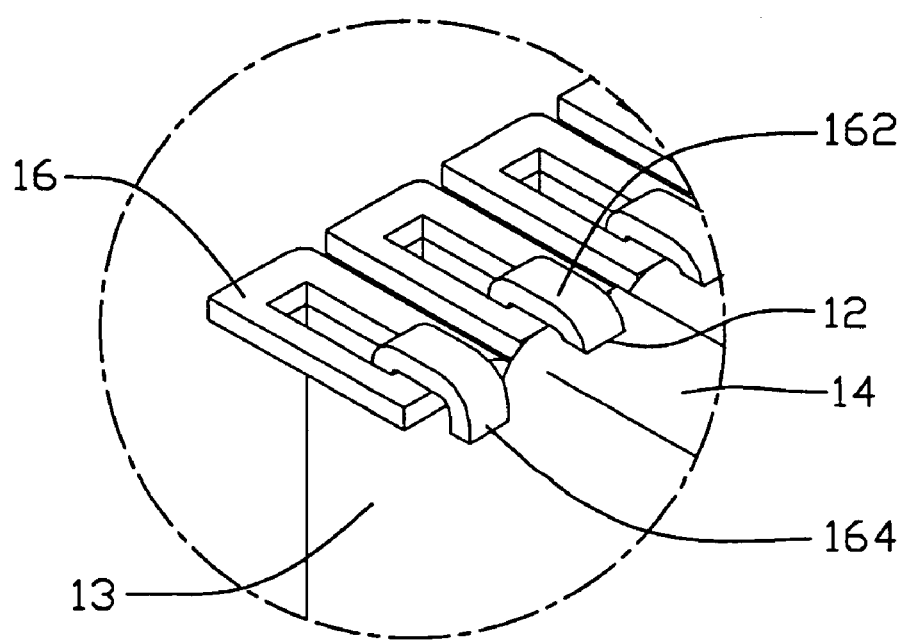
FIG. 3 is an enlarged view of an indicated portion III of FIG. 1.

Referring also to FIGS. 2–3, each of the fins 12 further includes a shortened flange 16 formed at each corner of the fin 12. The shortened flange 16 is positioned adjacent to a corresponding elongated flange 14 and extending transversely from the body 13 in an opposite direction to the elongated flange 14. Each of the elongated flanges 14 defines a pair of holes 142 as second engaging members at respective opposite sides thereof. A connecting piece 162 as a first engaging member is integrally formed from the shortened flange 16 and is bent toward the elongated flange 14 of an adjacent fin 12. A free end portion of the connecting piece 162 is then successively bent downwardly to form an engaging piece 164 in alignment with the corresponding hole 142 of the elongated flange 14 of the adjacent fin 12.

In assembly of the plurality of fins 12, every two adjacent fins 12 are combined via the engaging pieces 164 of one fin 12 engage in the respective holes 142 of the elongated flange 14 of the other fin 12. Thus, the plurality of fins 12 are fastened and joined with each other to form a cooling fin assembly with the elongated bottom flanges 14 of the fins 12 being flush with each other to define a planar surface for attachment to the top face 112 of the base 11.

Figure 4:
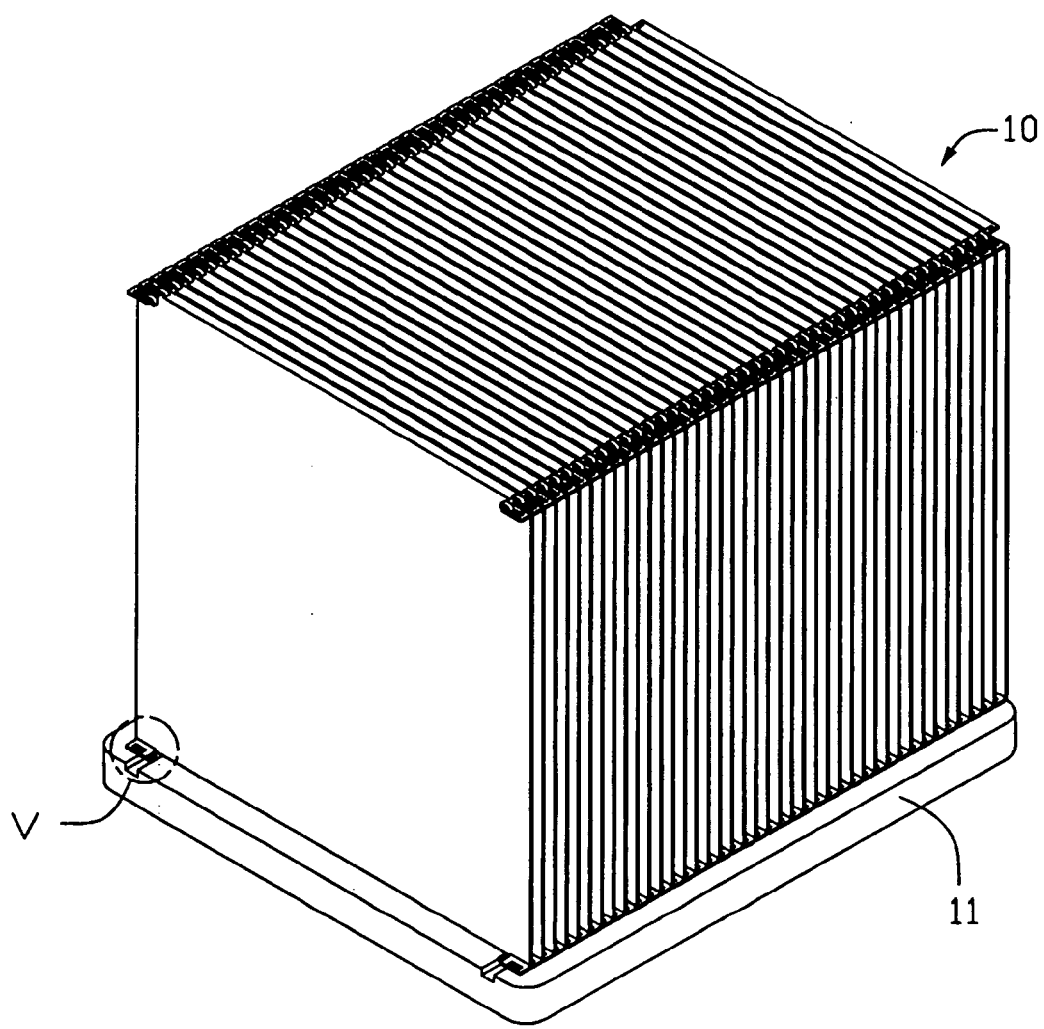
FIG. 4 is an assembled view of FIG. 1.
Figure 5:
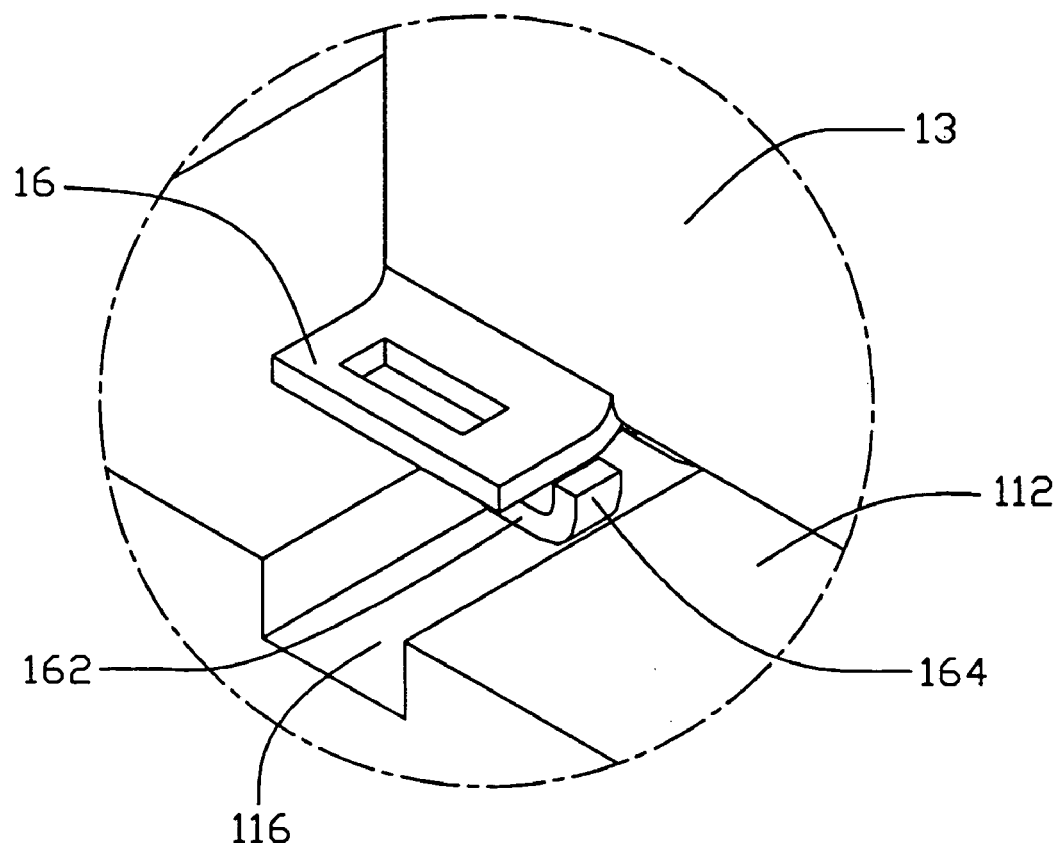
FIG. 5 is an enlarged view of an indicated portion V of FIG. 4.

Referring to FIGS. 4–5, the combined cooling fin assembly is attached to the top face 112 of the base 11 with the connecting pieces 162 and the associated engaging pieces 164 formed at the bottom side of each fin 12 correspondingly received in the grooves 116 of the base 11 such that the planar surface of the cooling fin assembly is physically and in thermal contact with the top face 112 of the base 11.

Figure 6:
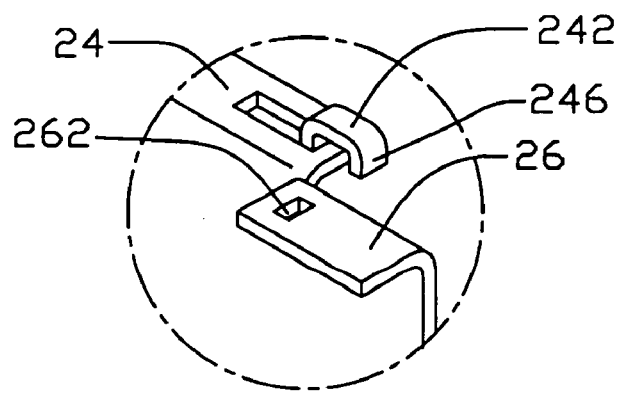
FIG. 6 is similar to FIG. 2, showing the interlocking structure of an alternative embodiment of the present invention.
Figure 7:
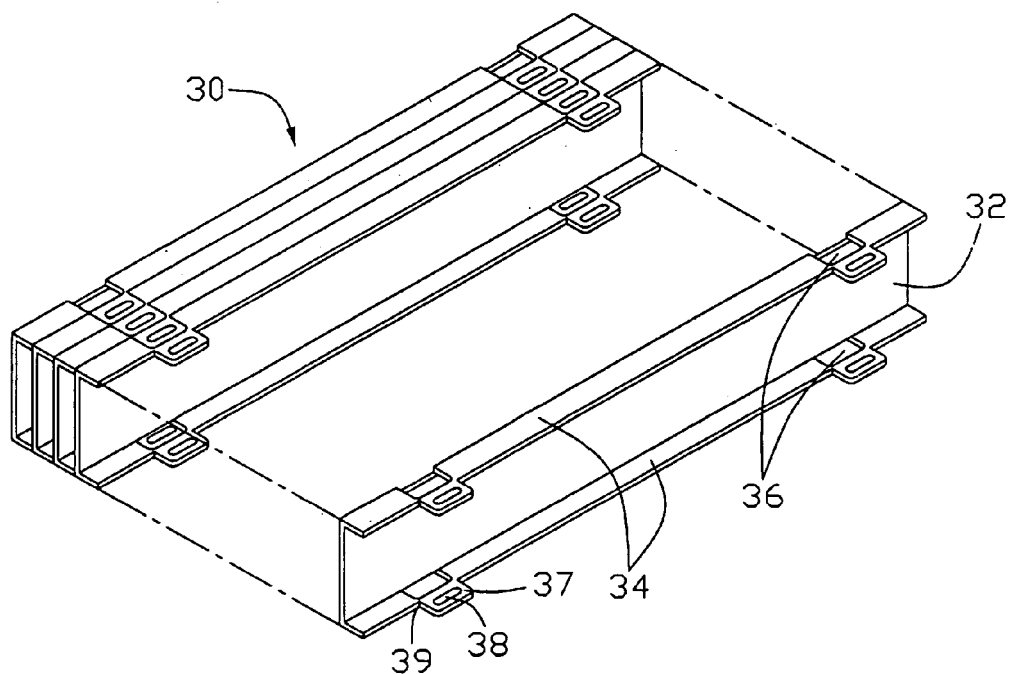
FIG. 7 is an isometric view of a heat sink in accordance with prior art.

FIG. 6 is similar to FIG. 2, but showing another kind of cooling fin structure according to an alternative embodiment of the present invention. The connecting piece 242 and the engaging piece 246 are integrally formed from the elongated flange 24 of the fin. The hole 262, which is in alignment with the engaging piece 246, is defined in the shortened flange 26. A plurality of this kind of cooling fins is combined in the same way as the above-mentioned procedures.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink comprising a plurality of cooling fins stacked between two opposite outmost cooling fins and a base attachable to said cooling fins, each of the plurality of cooling fins comprising a main body, wherein at least one side edge of the main body is provided with at least two flanges extending in opposite directions from the main body and successively arranged along a width direction of the main body, one flange defines a hole therein and the other flange has a connecting piece formed therefrom, the free end of the connecting piece forms an engaging piece in alignment with said hole, and the engaging piece of each of the plurality of coaling fins engages in the hole of an adjacent cooling fin whereby the plurality of cooling fins are fastened and joined with each other and wherein the at least two flanges are provided at each of two opposite side edges of the main body, the at least two flanges comprise a first flange and a second flange disposed adjacent to one side of the first flange, the connecting piece projects above the flange from which the connecting piece forms and the base defines a groove for receiving the connecting piece therein when attached thereto to allow the flange to thermally engage with the base.

2. The heat sink of claim 1, wherein the second flange is disposed at a corner of the main body.

3. The heat sink of claim 1, wherein the hole is defined in the first flange and the connecting piece is integrally formed from the second flange.

4. The heat sink of claim 1, wherein the hole is defined in the second flange and the connecting piece is integrally formed from the first flange.

* * * * *

UNITED STATES PATENT AND TRADEMARK OFFICE
CERTIFICATE OF CORRECTION

| | | |
|---|---|---|
| PATENT NO. | : 7,174,955 B2 | Page 1 of 1 |
| APPLICATION NO. | : 11/018070 | |
| DATED | : February 13, 2007 | |
| INVENTOR(S) | : Yong Zhong, Wan-Lin Xia and Tao Li | |

It is certified that error appears in the above-identified patent and that said Letters Patent is hereby corrected as shown below:

On Title Page:

Item (30) Foreign Application Priority Data, "Oct. 8, 2004" should read

--Aug. 10, 2004--, and "2004 2 0082906" should read --2004 2 0082906.4--

Signed and Sealed this

Eighteenth Day of September, 2007

JON W. DUDAS
*Director of the United States Patent and Trademark Office*